(12) United States Patent
Madni

(10) Patent No.: US 6,995,610 B2
(45) Date of Patent: Feb. 7, 2006

(54) AMPLIFIER AND RADIO FREQUENCY TUNER

(75) Inventor: Arshad Madni, Swindon (GB)

(73) Assignee: Zarlink Semiconductor Limited, Wiltshire (GB)

(*) Notice: Subject to any disclaimer, the term of this patent is extended or adjusted under 35 U.S.C. 154(b) by 183 days.

(21) Appl. No.: 10/439,126

(22) Filed: May 15, 2003

(65) Prior Publication Data

US 2003/0222711 A1 Dec. 4, 2003

(30) Foreign Application Priority Data

May 29, 2002 (GB) .............................. 0212335

(51) Int. Cl.
*H03F 1/36* (2006.01)

(52) U.S. Cl. .......................... 330/85; 330/291
(58) Field of Classification Search .................. 330/85, 330/86, 260, 271, 282, 291
See application file for complete search history.

(56) References Cited

U.S. PATENT DOCUMENTS 5,374,966 A 12/1994 Weigand ..................... 330/98
5,498,865 A * 3/1996 Gaboury et al. .............. 330/59
5,581,213 A * 12/1996 Linder et al. ................ 330/86
5,631,598 A * 5/1997 Miranda et al. ............ 327/540
6,137,101 A * 10/2000 Yokogawa et al. .......... 330/59

FOREIGN PATENT DOCUMENTS

GB 2 305563 8/1996

OTHER PUBLICATIONS

Search Report regarding corresponding Application No. GB 0212335.4 dated Nov. 26, 2002.

* cited by examiner

*Primary Examiner*—Khanh V. Nguyen
(74) *Attorney, Agent, or Firm*—Renner, Otto, Boisselle & Sklar, LLP

(57) ABSTRACT

An LNA for use as an input stage of a radio frequency tuner comprises an inverting amplifier stage and a transconductance stage. The amplifier stage has an input connected via an input resistance to an input of the amplifier and via a feedback resistance to an output of the amplifier stage. The transconductance stage passes a current through the input resistance which is substantially proportional to the output voltage of the amplifier stage.

16 Claims, 3 Drawing Sheets

AMPLIFIER AND RADIO FREQUENCY TUNER

TECHNICAL FIELD

The present invention relates to an amplifier, for example for use as a low noise amplifier (LNA) in a radio frequency tuner. The present invention also relates to a radio frequency tuner including such an amplifier.

SUMMARY

According to a first aspect of the invention, there is provided an amplifier comprising: an inverting amplifier stage having an input connected via an input resistance to an input of the amplifier and via a feedback resistance to an output of the amplifier stage; and a transconductance stage for passing through the input resistance a current substantially proportional to the output voltage of the amplifier stage.

The amplifier stage may comprise a common emitter or common source transistor.

The amplifier stage may comprise an output emitter follower or source follower.

The transconductance stage may comprise a long tail pair of transistors. The collectors or drains of the long tail pair of transistors may be connected across the input resistance. The transconductance stage may comprise a constant tail current source. The long tail pair of transistors may comprise emitter or source degeneration resistances. The collector or drain of each of the transistors of the long tail pair may be connected to a respective constant current source.

The amplifier may comprise a low noise amplifier.

According to a second aspect of the invention, there is provided a radio frequency tuner comprising an amplifier according to the first aspect of the invention.

It is thus possible to provide an amplifier which has a very good noise figure together with good distortion performance (a high IIP3) and a good S11. Such an amplifier may be implemented with good power dissipation efficiency.

BRIEF DESCRIPTION OF THE DRAWINGS

Like reference numerals refer to like parts throughout the drawings.

DETAILED DESCRIPTION

Figure 1:
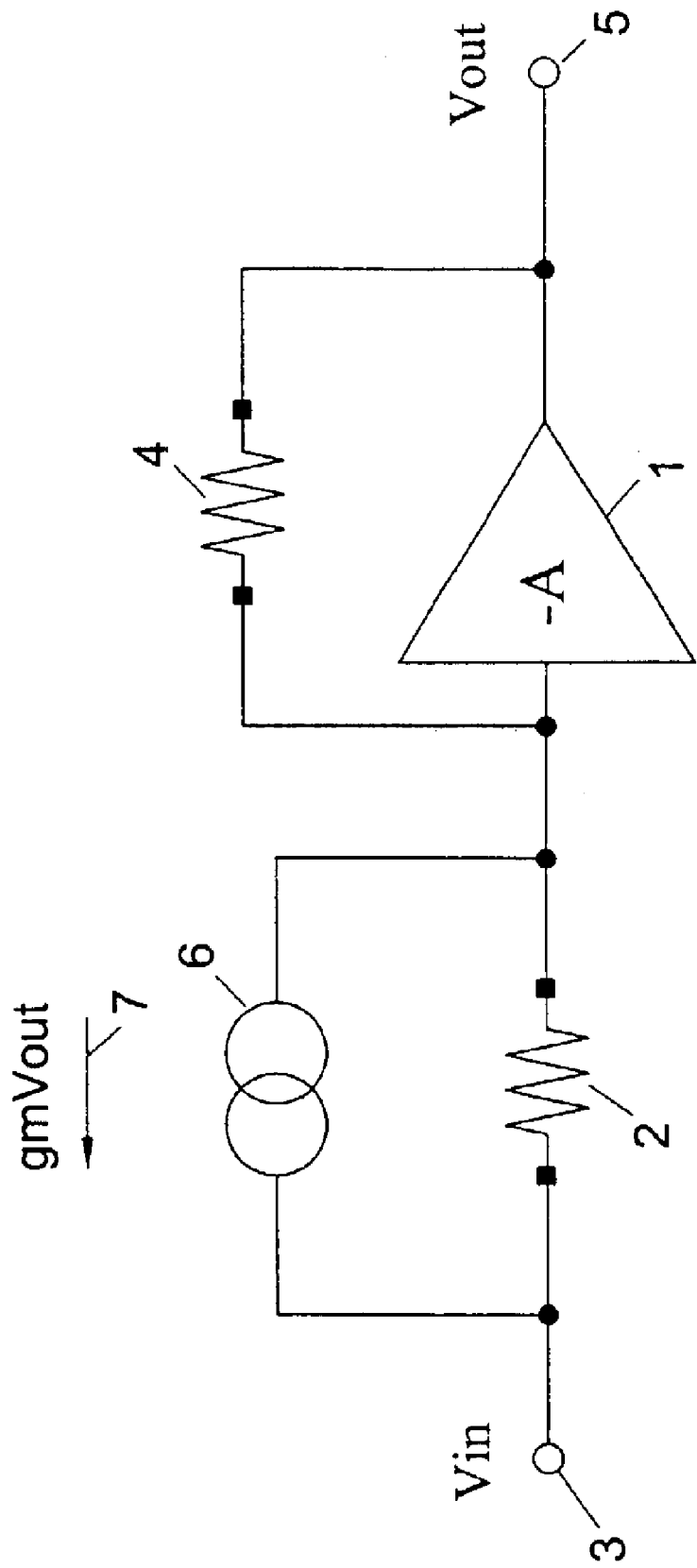
FIG. 1 is a schematic circuit diagram of an amplifier constituting an embodiment of the invention.

The amplifier shown in FIG. 1 is suitable for use as an LNA ahead of a frequency changer or a first frequency changer of a radio frequency tuner. The amplifier comprises an amplifier stage 1 whose input is connected via an input resistor 2 to an input 3 of the amplifier and via a resistor 4 to an output of the amplifier stage, which is also connected to an output 5 of the amplifier. The amplifier stage 1 has an open loop gain −A. The amplifier also comprises a transconductance stage illustrated diagrammatically at 6 and having a transconductance gm. The amplifier receives an input signal Vin at the input 3 and supplies an output Vout at the output 5. The transconductance stage 6 converts the output voltage of the amplifier stage 1 to a current gm. Vout, which is applied across the input resistor 2. An arrow 6 indicates the output phase of the transconductance stage 6 such that the output current gm. Vout is applied to the terminal of the resistor 2 connected to the input 3 with respect to the other terminal of the resistor 2 connected to the input of the amplifier stage 1.

The input voltage Vin is given by:

$$Vin = (i + gm \cdot Vout) \cdot Rin + i \cdot \frac{Rf}{1+A}$$

where Rin is the resistance of the input resistor 2, Rf is the resistance of the feedback resistor 4, and i is the signal current which would flow through the resistor 2 in the absence of the transconductance stage 6. The output voltage Vout is given by:

$$Vout = -A \cdot \frac{Rf}{1+A} \cdot i$$

Substituting this expression for Vout into the expression for Vin gives:

$$Vin = \left(1 + gm \cdot A \cdot \frac{Rf}{1+A}\right) \cdot Rin \cdot i + i \frac{Rf}{1+A}$$

The gain A of the amplifier stage 1 is arranged to be relatively large and, as A tends to infinity, the expression for the input voltage Vin may be rewritten as:

$$Vin = i \cdot \left([1 + gm \cdot Rf]Rin + \frac{Rf}{1+A}\right)$$

The input impedance of the amplifier shown in FIG. 1 may be written as:

$$Zin = \frac{Vin}{i} = \left([1 + gm \cdot Rf]Rin + \frac{Rf}{1+A}\right)$$

and the voltage gain of the amplifier may be written as:

$$\frac{Vout}{Vin} = \frac{-Rf}{\left([1 + gm \cdot Rf]Rin + \frac{Rf}{1+A}\right)} \cdot \frac{A}{1+A} = \frac{-Rf}{[1 + gm \cdot Rf]Rin}$$

The expression for the input impedance Zin may be rewritten as (1+α) Rin, where α=gm.Rf and the gain A is assumed to be very large (tending to infinity). In the absence of the transconductance stage, the input impedance would be substantially equal to Rin. In the amplifier of FIG. 1, this is boosted by the factor (1+α) so that a smaller value resistor 2 may be used to achieve a higher input impedance and at the same time obtain a good S11.

In a typical example of the amplifier shown in FIG. 1, in order to minimise the noise figure NF, the value Rin of the input resistor 2 may be set to 10 ohms and the factor (1+α) may be set to 10. This gives an input impedance of 100 ohms and an S11 of −17 dB. The noise figure of the amplifier is dominated by the resistance Rin of the input resistor 2 and by the contribution of noise from the base spreading resistance Rbb and the base current shot noise of the input stage of the amplifier stage 1. The transconductance stage 6 may be implemented with resistors having values at least five times that of Rin, which gives rise to low current noise so that the noise contribution of the transconductance stage 6 is negligible. The noise figure of the whole amplifier may be reduced to 3 dB while maintaining S11 at approximately −20 dB and IIP3 at substantially +20 dBm.

Figure 2:
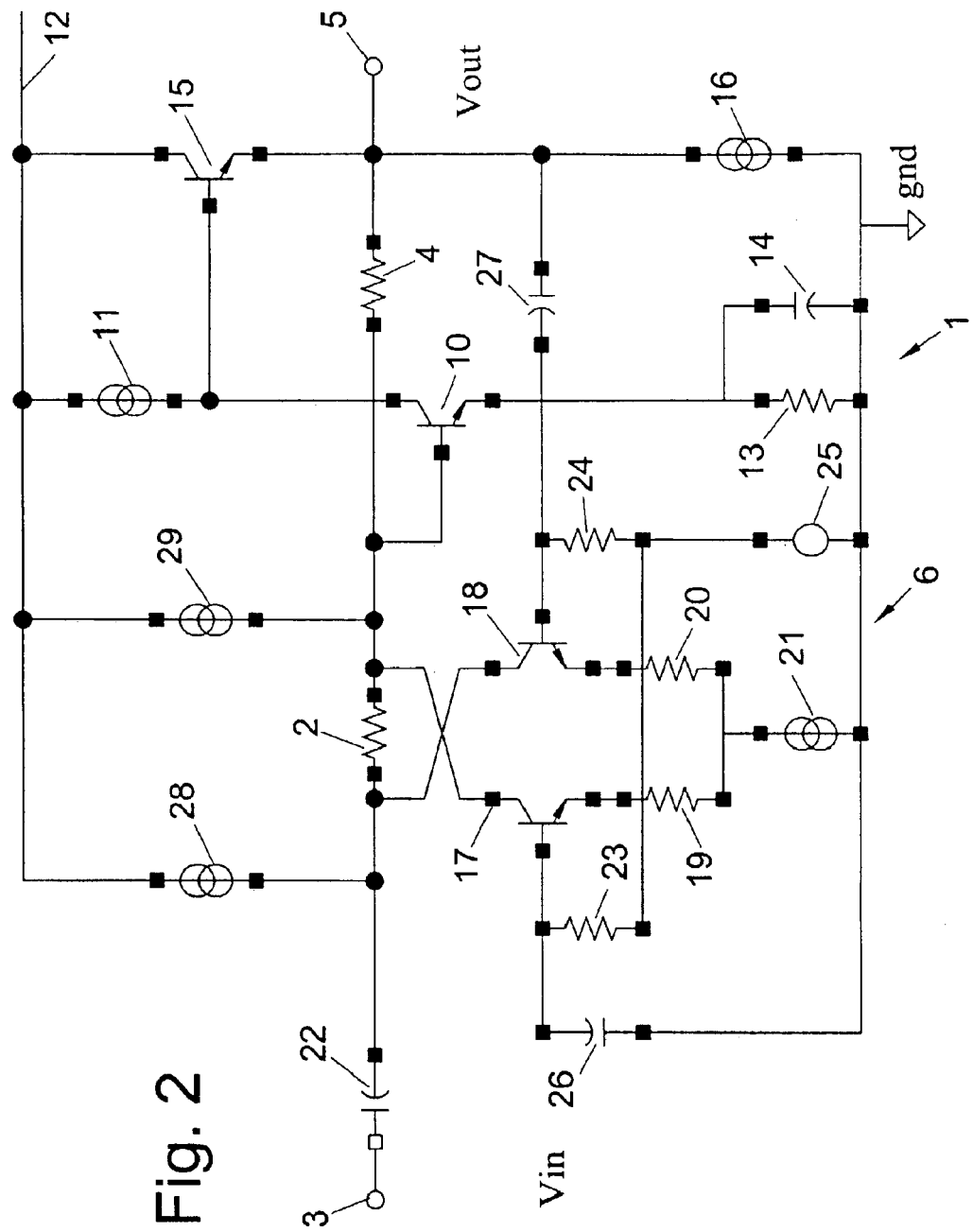
FIG. 2 is a circuit diagram of the amplifier of FIG. 1.

In the example shown in FIG. 2, the amplifier stage 1 comprises a common emitter input amplifying stage and an emitter follower output stage. The input stage comprises an NPN bipolar junction transistor 10 having a collector load in the form of a constant current source 11 connected to a positive power supply line 12. The emitter of the transistor 10 is connected to ground gnd via a resistor 13, which is bypassed at signal frequencies by a capacitor 14. The collector of the transistor 10 is connected to the emitter follower output stage comprising an NPN bipolar junction transistor 15 whose emitter load comprises a constant current source 16.

The transconductance stage 6 comprises a long tail pair of NPN bipolar junction transistors 17 and 18, whose emitters are connected via emitter degeneration resistors 19 and 20, respectively, to a constant tail current source 21. The collector of the transistor 17 is connected to a first end of the input resistor 2 connected to the base of the transistor 10. The collector of the transistor 18 is connected to the other end of the input resistor 2 and via a coupling capacitor 22 to the input 3 of the amplifier. The bases of the transistors 17 and 18 are connected via isolating resistors 23 and 24, respectively, to a bias voltage source 25. The base of the transistor 17 is grounded at signal frequencies by a capacitor 26 whereas the base of the transistor 18 forming the input of the transconductance stage 6 is connected via a coupling capacitor 27 to the output of the amplifier stage 1 and to the output 5 of the amplifier. The ends of the input resistor 2 are connected to constant current sources 28 and 29 so as to balance the DC voltage across the resistor 2.

Figure 3:
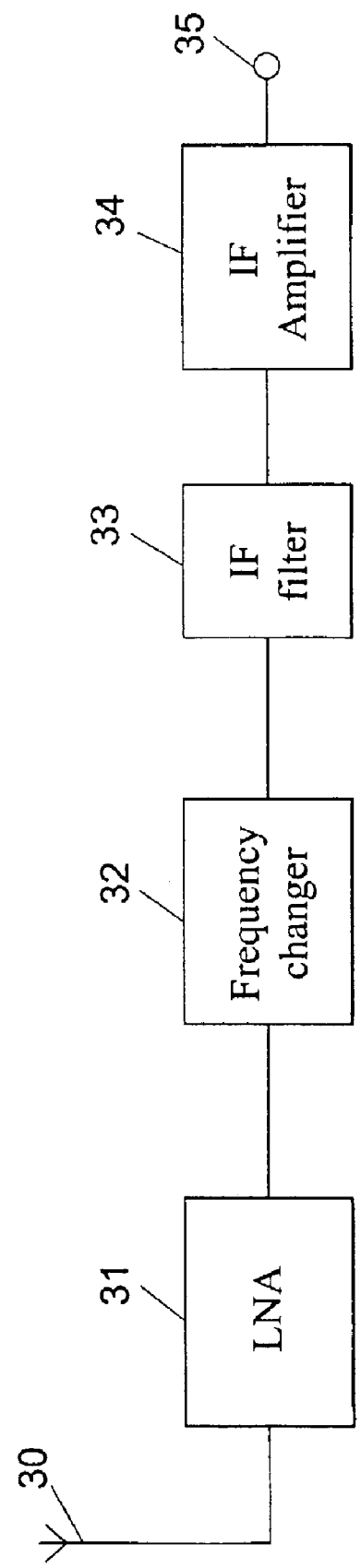
FIG. 3 is a block schematic diagram of a radio frequency tuner including an amplifier as shown in FIGS. 1 and 2.

FIG. 3 illustrates diagrammatically a radio frequency tuner having an input 30 for connection, for example to a terrestrial aerial, a satellite aerial system or a cable distribution system. The input 30 is connected to an LNA 31 comprising an amplifier as shown in FIGS. 1 and 2. The output of the LNA 31 is connected to a frequency changer 32 which selects a channel for reception and converts this to a fixed intermediate frequency (IF). The IF output signal of the frequency changer 32 is filtered by an IF filter 33 and amplified by an IF amplifier 34 before being supplied to an output 35 of the tuner for connection to a demodulator (not shown). The amplifier of FIGS. 1 and 2 has a low noise figure combined with good IIP3 and S11 figures and is therefore suitable for use as the LNA 31 of the tuner of FIG. 3, although such an amplifier may be used in any application requiring these performance characteristics. These performance characteristics can be achieved with relatively low power dissipation.

What is claimed is:

1. An amplifier comprising: an input for receiving a radio frequency input signal be amplified; an input resistance; a feedback resistance; an inverting amplifier stage having an output and an input connected via said input resistance to said input of said amplifier and via said feedback resistance to said output of said amplifier stage, whereby said input resistance passes a signal current from said input of said amplifier to said input of said amplifier stage; and a transconductance stage for passing through said input resistance a current which is substantially proportional to an output voltage of said amplifier stage and which is additional to said signal current.

2. An amplifier as claimed in claim 1, in which said amplifier stage comprises one of a common emitter transistor and a common source transistor.

3. An amplifier as claimed in claim 1, in which said amplifier stage comprises one of an output emitter follower and an output source follower.

4. An amplifier as claimed in claim 1, in which said transconductance stage comprises a long tail pair of transistors.

5. An amplifier as claimed in claim 4, said long tail pair of transistors have output terminals connected across said input resistance.

6. An amplifier as claimed in claim 4, in which said transconductance stage comprises a constant tail current source.

7. An amplifier as claimed in claim 4, in which said long tail pair of transistors comprises one of emitter and source degeneration resistances.

8. An amplifier as claimed in said claim 4, in which each of said transistors of said long tail pair has an output terminal and said amplifier comprises respective constant current sources connected to respective ones of said output terminals.

9. An amplifier as claimed in claim 1, comprising a low noise amplifier.

10. A radio frequency tuner including an amplifier comprising: an input for receiving a radio frequency input signal to be amplified; an input resistance; a feedback resistance; an inverting amplifier stage having an output and an input connected via said input resistance to said input of said amplifier and via said feedback resistance to said output of said amplifier stage, whereby said input resistance passes a signal current from said input of said amplifier to said input of said amplifier stage; and a transconductance stage for passing through said input resistance a current which is substantially proportional to an output voltage of said amplifier stage and which is additional to said signal current.

11. An amplifier comprising: an input; an input resistance; a feedback resistance; an inverting amplifier stage comprising one of an output emitter follower and an output source follower and having an output and an input connected via said input resistance to said input of said amplifier and via said feedback resistance to said output of said amplifier stage; and a transconductance stage for passing through said input resistance a current substantially proportional to an output voltage of said amplifier stage.

12. An amplifier comprising: an input; an input resistance; a feedback resistance; an inverting amplifier stage having an output and an input connected via said input resistance to said input of said amplifier and via said feedback resistance to said output of said amplifier stage; and a transconductance stage for passing through said input resistance a current substantially proportional to an output voltage of said amplifier stage, said transconductance stage comprising a long tail pair of transistors having output terminals connected across said input resistance.

13. An amplifier comprising: an input; an input resistance; a feedback resistance; an inverting amplifier stage having an output and an input connected via said input resistance to said input of said amplifier and via said feedback resistance to said output of said amplifier stage; and a transconductance stage for passing through said input resistance a current substantially proportional to an output voltage of said amplifier stage, said transconductance stage comprising a long tail pair of transistors, each of said transistors of said long tail pair having an output terminal and said amplifier comprising respective constant current sources connected to respective ones of said output terminals.

14. A radio frequency tuner including en amplifier comprising: an input; an input resistance; a feedback resistance;

an inverting amplifier stage comprising one of an output emitter follower and an output source follower and having an output and an input connected via said input resistance to said input of said amplifier and via said feedback resistance to said output of said amplifier stage; and a transconductance stage for passing through said input resistance a current substantially proportional to an output voltage of said amplifier stage.

15. A radio frequency tuner including an amplifier comprising: an input; an input resistance; a feedback resistance; an inverting amplifier stage having an output and an input connected via said input resistance to said input of said amplifier and via said feedback resistance to said output of said amplifier stage; and a transconductance stage for passing through said input resistance a current substantially proportional to an output voltage of said amplifier stage, said transconductance stage comprising a long tail pair of transistors having output terminals connected across said input resistance.

16. A radio frequency tuner including an amplifier comprising: an input; an input resistance; a feedback resistance; an inverting amplifier stage having an output and an input connected via said input resistance to said input of said amplifier and via said feedback resistance to said output of said amplifier stage; and a transconductance stage for passing through said input resistance a current substantially proportional to an output voltage of said amplifier stage, said transconductance stage comprising a long tail pair of transistors, each of said transistors of said long tail pair having an output terminal and said amplifier comprising respective constant current sources connected to respective ones of said output terminals.

* * * * *